(12) United States Patent
Badillo et al.

(10) Patent No.: US 9,306,402 B1
(45) Date of Patent: Apr. 5, 2016

(54) CIRCUITS AND METHODS FOR CAPACITOR CHARGING

(71) Applicant: Analog Devices, Inc., Norwood, MA (US)

(72) Inventors: Dean A. Badillo, Schaumburg, IL (US); Mohammad Asmani, Ladera Ranch, CA (US); Klaus Juergen Schoepf, Chandler, AZ (US); Reimund Rebel, Maricopa, AZ (US); Peiqing Zhu, Coppell, TX (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/174,770

(22) Filed: Feb. 6, 2014

Related U.S. Application Data

(60) Provisional application No. 61/761,935, filed on Feb. 7, 2013.

(51) Int. Cl.
*H03B 5/36* (2006.01)
*H03K 3/0231* (2006.01)
*H02J 7/00* (2006.01)

(52) U.S. Cl.
CPC ... *H02J 7/00* (2013.01); *H03B 5/36* (2013.01); *H03K 3/0231* (2013.01)

(58) Field of Classification Search
CPC .............. H03B 5/30; H03B 5/32; H03B 5/36; H03B 5/362; H03B 5/364; H03K 3/0231; H03K 3/354; H03K 4/12; H03K 4/50
USPC ....... 331/111, 113 R, 116 FE, 116 M, 116 R, 331/143–145, 153, 154, 158, 160
See application file for complete search history.

(56) References Cited

U.S. PATENT DOCUMENTS

| | | | |
|---|---|---|---|
| 4,492,935 A * | 1/1985 | Fleischer et al. | 331/135 |
| 5,654,678 A * | 8/1997 | Miyazaki | 331/176 |
| 6,020,792 A * | 2/2000 | Nolan et al. | 331/111 |
| 6,606,007 B1 * | 8/2003 | Washburn | 331/116 R |
| 7,123,109 B2 * | 10/2006 | Stevenson et al. | 331/109 |
| 7,902,933 B1 * | 3/2011 | Brennan | 331/158 |
| 7,911,285 B2 * | 3/2011 | Terada et al. | 331/158 |
| 8,766,731 B2 * | 7/2014 | Kamp et al. | 331/49 |
| 2011/0037527 A1 * | 2/2011 | Shrivastava et al. | 331/158 |
| 2014/0210565 A1 * | 7/2014 | Vilas Boas et al. | 331/158 |

* cited by examiner

*Primary Examiner* — Levi Gannon
(74) *Attorney, Agent, or Firm* — Wolf, Greenfield & Sacks, P.C.

(57) ABSTRACT

Circuits for charging capacitors in connection with oscillators are described. The oscillator may include a mechanical resonator. The circuits may include a charging element and a switched capacitor subcircuit to control operation of the charging element, and may be considered a charging circuit in some scenarios. The charging circuits may provide rapid charging of a capacitor to provide a reference voltage to the oscillator.

20 Claims, 6 Drawing Sheets

CIRCUITS AND METHODS FOR CAPACITOR CHARGING

CROSS-REFERENCE TO RELATED APPLICATIONS

This Application claims the benefit under 35 U.S.C. §119(e) of U.S. Provisional Application Ser. No. 61/761,935 entitled "Circuits and Methods for Capacitor Charging" filed Feb. 7, 2013, which is herein incorporated by reference in its entirety.

BACKGROUND

1. Field

The present application is directed to circuits and methods for capacitor charging as may be used in connection with oscillator circuits.

2. Related Art

Oscillators are used in devices such as cellular telephones, smartphones, personal digital assistants, clocks and computers to provide reference oscillating signals. One metric for measuring the quality of an oscillator is the time it takes the oscillator to startup, referring to the time it takes the oscillator to settle to a target frequency. Certain products which use oscillators specify acceptable startup times.

In practice, oscillators and other circuits are often realized as integrated circuits. Often it is desirable to maintain strict signal isolation to prevent creating undesirable spurious tones, and thus isolated circuit blocks are used. Signal isolation is aided by allowing separate ground and power supply pins for each isolated circuit block. In addition, external components (i.e., not integrated) are frequently needed.

FIG. 1A illustrates a conventional NMOS current mirror with high current amplifier. The circuit 100 includes a reference current source 101 providing a reference current Iref connected to a current mirror formed by NMOS transistors M1 and M2, with a resistor R1 connecting the gates of M1 and M2. The current mirror is also connected to analog circuit 102 via the NMOS transistor M2. The current amplifier A1 charges a capacitor C1 via switch S1. The crossed boxes in FIG. 1A represent pins to external components, and thus C1 is an external capacitor (i.e., not integrated with the other circuit components). Rgnd1, Rgnd2 and Rgnd3 are resistances that signify that each ground connection has some impedance. Because C1 is external, the node between C1 and Rgnd2 is not accessible to the designer of the integrated circuit.

In operation, the reference current Iref is applied to the NMOS current mirror and filtered to create a bias current (via M2) for the analog circuit 102. During startup, S1 is closed and S2 is open. After C1 is charged such that Vg(M1)=Vg(M2)=VC1, S1 is opened, S2 is closed, and the current amplifier A1 is powered down. The current Iamp of the current amplifier A1 flows to ground through Rgnd1. Similarly, the current Is(M1) through NMOS transistor M1 flows to ground through Rgnd1.

FIG. 1B illustrates the behavior of the voltage Vg(M1) on the gate of transistor M1 and the voltage VC1 on the capacitor C1 as a function of time for the circuit 100 of FIG. 1A. The y-axis represents voltage and the x-axis represents time. The origin corresponds to t=0, prior to circuit operation. The illustrated graph illustrates the scenario in which the current amplifier A1 is turned on at t=0 and turned off at the point in time labeled as toff.

FIG. 2A illustrates an alternative conventional configuration to that of FIG. 1A. Here, the circuit 200 includes conduction between the grounds represented by the parasitic resistance Rpar. FIG. 2B illustrates the behavior of the voltage Vg(M1) on the gate of transistor M1 and the voltage VC1 on the capacitor C1 as a function of time for the circuit 200 of FIG. 2A.

BRIEF SUMMARY

According to an aspect of the present application, an integrated circuit is provided, comprising a first terminal configured to couple to an oscillator circuit, a second terminal configured to couple to a capacitor, and an operational amplifier having an inverting input terminal, a non-inverting input terminal, and an output terminal, the output terminal being configured to couple directly to the capacitor to charge the capacitor. The integrated circuit further comprises a switched capacitor subcircuit coupled to the inverting and non-inverting input terminals of the operational amplifier. The switched capacitor subcircuit comprises a first capacitor and a second capacitor, the first capacitor being configured to store a first voltage during a first switching state of the switched capacitor subcircuit, the first voltage including an offset voltage representing a voltage through a ground connection of the operational amplifier. The second capacitor may be configured to store a second voltage during a second switching state of the switched capacitor subcircuit, the second voltage lacking the offset voltage. The first and second capacitors may be configured to be coupled in series to the non-inverting input terminal of the operational amplifier during a third switching state.

According to an aspect of the present application, a charging circuit is provided, comprising a charging element configured to couple to and charge a capacitor to a target voltage, and an offset compensation subcircuit coupled to the charging element and configured to detect an offset voltage between the target voltage and an actual voltage to which the capacitor is charged by the charging element when charging is stopped. The offset compensation subcircuit may be configured to provide a compensation signal to the charging element to cause the charging element to adjust the actual voltage based on the offset voltage. The charging circuit comprises at least one terminal coupling the charging circuit to an oscillator circuit to control, at least in part, operation of the oscillator circuit with the target voltage.

According to an aspect of the present application, a method of operating a charging circuit is provided, comprising connecting a first capacitor of a switched capacitor subcircuit during a first switching interval to store a first voltage thereon, connecting a second capacitor of the switched capacitor subcircuit during a second switching interval to store a second voltage thereon, and coupling the first and second capacitors during a third switching interval to form a voltage difference between the first and second voltages. The method further comprises applying the voltage difference to an input of a charging element of the charging circuit. The first voltage or second voltage comprises a voltage representing an offset created by the charging element. The voltage difference lacks the voltage offset.

According to an aspect of the present application, a device is provided, comprising an oscillator comprising a mechanical resonator, and a charging circuit coupled to the oscillator and configured to charge a capacitor coupled to the oscillator to a reference voltage. The charging circuit comprises a charging element configured to couple to and charge the capacitor to a target voltage, and an offset compensation subcircuit coupled to the charging element and configured to detect an offset voltage between the target voltage and an actual voltage to which the capacitor is charged by the charging element when charging is stopped. The offset compensation subcircuit may provide a compensation signal to the charging element to cause the charging element to adjust the actual voltage based on the offset voltage. The charging circuit further comprises at least one terminal coupling the charging circuit to an oscillator circuit to control, at least in part, operation of the oscillator circuit with the target voltage.

According to an aspect of the present application, a device is provided, comprising an oscillator comprising a mechanical resonator, and a charging circuit integrated with the oscillator and configured to charge a capacitor coupled to the oscillator to a target voltage. The charging circuit comprises a charging element configured to couple to and charge the capacitor to a target voltage, an offset compensation subcircuit coupled to the charging element and configured to detect an offset voltage between the target voltage and an actual voltage to which the capacitor is charged by the charging element when charging is stopped and to provide a compensation signal to the charging element to cause the charging element to adjust the actual voltage to the target voltage based on the offset voltage, and at least one terminal coupling the capacitor to an oscillator circuit to control, at least in part, operation of the oscillator circuit with the target voltage.

According to an aspect of the present application, a charging circuit is provided, comprising a charging element configured to couple to and charge a capacitor to a target voltage, an offset compensation subcircuit coupled to the charging element and configured to detect an offset voltage between the target voltage and an actual voltage to which the capacitor is charged by the charging element when charging is stopped and to provide a compensation signal to the charging element to cause the charging element to adjust the actual voltage based on the offset voltage, and at least one terminal configured to couple the capacitor to an oscillator circuit to control, at least in part, operation of the oscillator circuit with the target voltage.

According to an aspect of the present application, a method of operating a charging circuit is provided, comprising connecting a first capacitor of a switched capacitor subcircuit during a first switching interval to store a first voltage thereon, connecting a second capacitor of the switched capacitor subcircuit during a second switching interval to store a second voltage thereon, coupling the first and second capacitors during a third switching interval to form a voltage difference between the first and second voltages, and applying the voltage difference to an input of a charging element of the charging circuit, wherein the voltage difference comprises a voltage offset representing an offset voltage created by the charging element.

According to an aspect of the present application, an integrated circuit is provided, comprising an operational amplifier having at least two input terminals and an output terminal, the output terminal being configured to switchably couple to a first capacitor to charge the first capacitor, a switched capacitor subcircuit coupled to an input terminal of the operational amplifier and comprising second and third capacitors, the switched capacitor subcircuit being switchably configured to store a first voltage of a node of the integrated circuit on the second capacitor and a second voltage of the node on the third capacitor, the first voltage of the node corresponding to an active state of the operational amplifier, the second voltage of the node corresponding to an inactive state of the operational amplifier, the switched capacitor subcircuit further being configured to switchably couple the second and third capacitors to the input terminal of the operational amplifier, and an oscillator configured to switchably couple to the first capacitor.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1A:
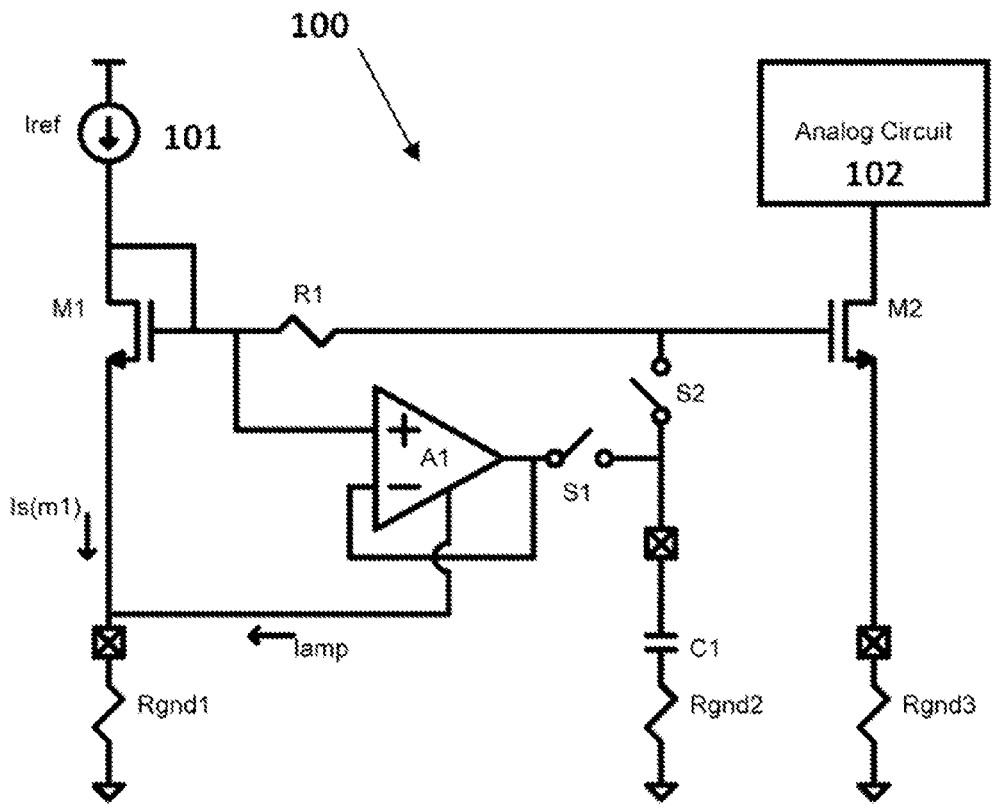
FIG. 1A illustrates a conventional charging circuit.
Figure 1B:
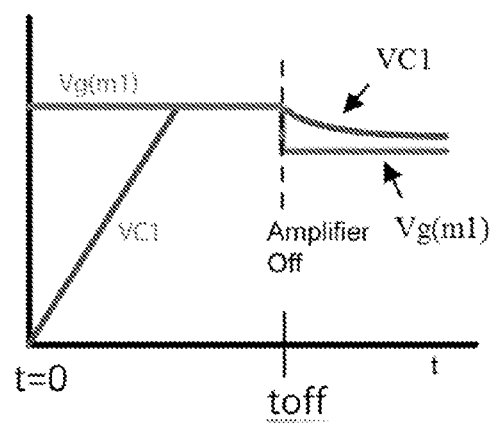
FIG. 1B illustrates the charging behavior of the circuit of FIG. 1A.
Figure 2A:
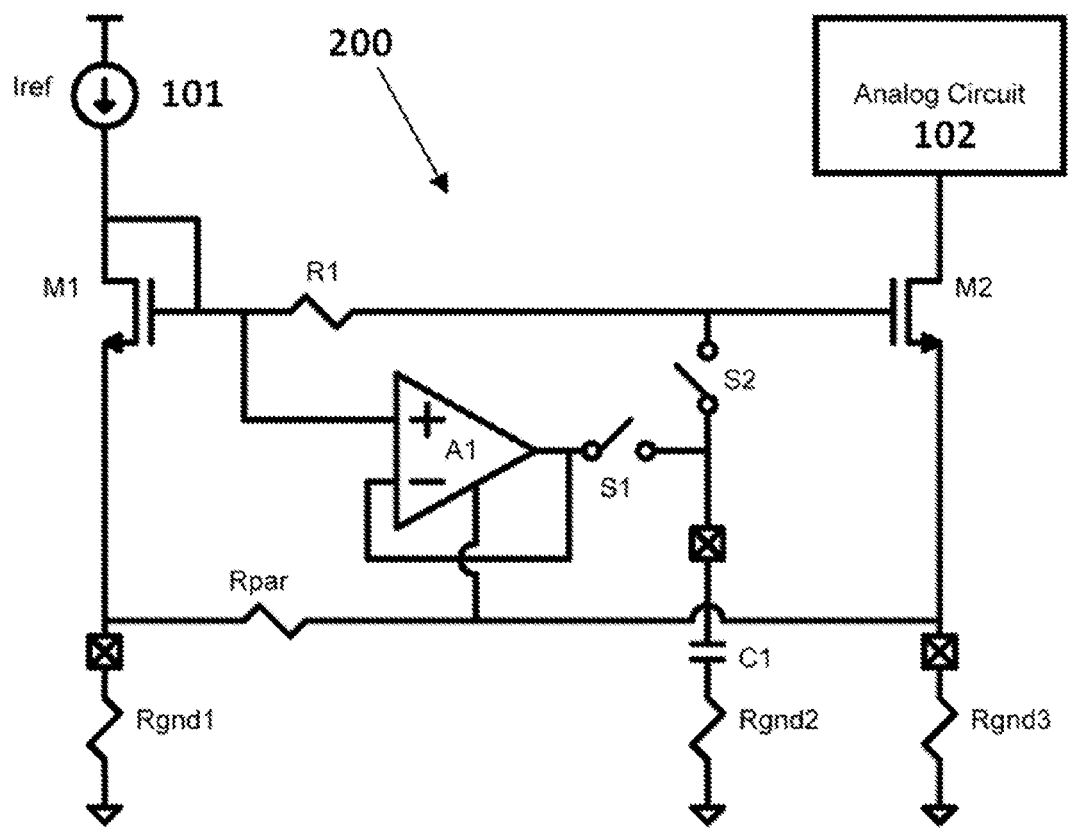
FIG. 2A illustrates an alternative conventional charging circuit.
Figure 2B:
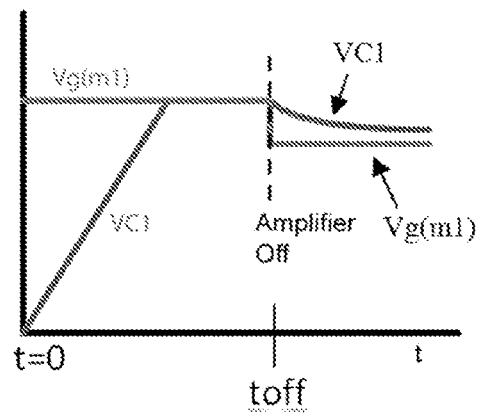
FIG. 2B illustrates the charging behavior of the circuit of FIG. 2A.

The circuits 100 and 200 of FIGS. 1A and 2A experience difficulty in rapidly charging the capacitor C1 to the desired voltage, as can be seen from the behavior illustrated in FIGS. 1B and 2B. External components, such as capacitor C1, will have different impedances to ground than the integrated circuit. As a result, a voltage offset occurs when attempting to charge the capacitor C1 rapidly. As shown in FIG. 1B, because the current Iamp of the current amplifier A1 flows to ground, the voltage Vg(M1) on the gate of transistor M1 is increased by an amount equal to Iamp×Rgnd1. Because of the voltage on the gate of transistor M1 is used as a reference for the current amplifier A1, the capacitor C1 is charged to the wrong voltage. This can be seen in FIG. 1B by the voltage VC1 just prior to the current amplifier A1 being turned off at toff. Namely, a voltage step of Iamp×Rgnd1 appears after the current amplifier A1 is turned off and Vg(M1) settles to its proper value. Similar behavior occurs in the circuit 200 of FIG. 2A, as shown by the behavior of FIG. 2B.

Thus, aspects of the present application provide charging circuits configured to charge a capacitor without the voltage offset problems of the conventional circuits. In some embodiments, the charging circuits may include and utilize a switched capacitor subcircuit. The switched capacitor subcircuit may be suitably configured and operated to eliminate the offset voltage caused by a charging element (e.g., a current amplifier) of the charging circuit.

According to an aspect of the present application, an integrated circuit is provided comprising a charging element configured to charge an external capacitor. The charging element may be a current amplifier in some embodiments. The integrated circuit may include a switched capacitor subcircuit including two capacitors. One of the capacitors may be configured to store a voltage during a first switching cycle which includes an offset voltage owing to a current flow produced by the current amplifier. The second capacitor may be configured to store a voltage during a second switching cycle which does not include the offset voltage. The voltages on the first and second capacitors may then be suitably combined during a third switching cycle to provide to the charging element a voltage lacking the voltage offset. The charging element may then adjust a voltage on the external capacitor by an amount substantially equal to the offset voltage, thus leaving the external capacitor storing a desired voltage lacking the offset voltage.

The aspects and embodiments described above, as well as additional aspects and embodiments, are described further below. These aspects and/or embodiments may be used individually, all together, or in any combination of two or more, as the application is not limited in this respect.

Figure 3:
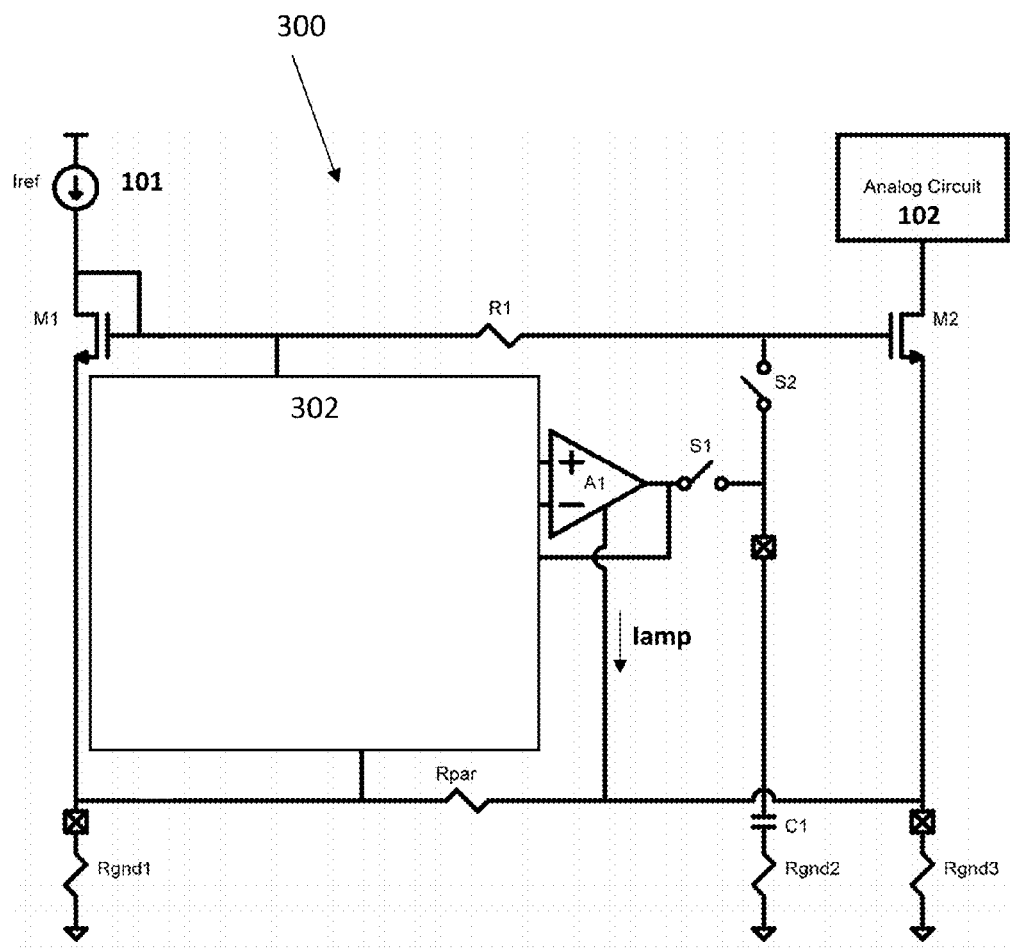
FIG. 3 illustrates a circuit for charging a capacitor according to a non-limiting embodiment.

FIG. 3 illustrates a circuit according to a non-limiting embodiment of the present application. As shown, the circuit 300 includes a switched capacitor subcircuit 302 in addition to the components previously described in connection with FIG. 2A. The switched capacitor subcircuit may be coupled to the gate of transistor M1, the non-inverting and inverting inputs of the current amplifier A1, and the ground connections through Rgnd1 and Rgnd3.

The switched capacitor subcircuit 302 may provide one or more reference voltages to the current amplifier A1, and in this manner control the output provided by the current amplifier to the capacitor C1. In some embodiments, the switched capacitor subcircuit 302 may provide two or more different reference voltages to the current amplifier A1 during different switching cycles (or periods). As previously described in connection with FIGS. 1A and 2A, the current amplifier A1 may have a current Iamp which flows to ground, for example via Rgnd1 and Rgnd3. The switched capacitor subcircuit 302 may be configured to provide, to the current amplifier, one or more reference voltages representative of or otherwise including a voltage arising from the amplifier current Iamp and one or more reference voltages not including a voltage arising from the amplifier current Iamp. In this manner, the current amplifier may be controlled to charge the capacitor C1 to a desired voltage irrespective of the current Iamp flowing through ground.

The switched capacitor subcircuit 302 may have any suitable configuration for controlling the current amplifier A1 to charge the capacitor C1 to a desired voltage without an offset voltage associated with the current from the current amplifier A1. The switched capacitor subcircuit 302 may include any suitable number of capacitors, and any suitable number of switches. The capacitors may have any suitable values, and may be fixed or variable capacitors. The switches may be any suitable switches, such as transistor switches or any other suitable type of switches. Control signals for controlling the switches of the switched capacitor subcircuit 302 may be provided in any suitable manner, for example being provided by a microprocessor or other control circuit not shown in FIG. 3.

It should be appreciated that a switched capacitor subcircuit is a non-limiting example of a circuit which may be used to control a charging element (e.g., current amplifier A1) to charge a capacitor to a voltage lacking an offset voltage. Other types of circuits may alternatively be used.

The current amplifier A1 represents a non-limiting example of a charging element suitable for charging a capacitor, such as capacitor C1. In some embodiments, the charging element may be an operational amplifier. In some embodiments, the charging element may be a high current amplifier. Alternative charging elements may be used.

Figure 4:
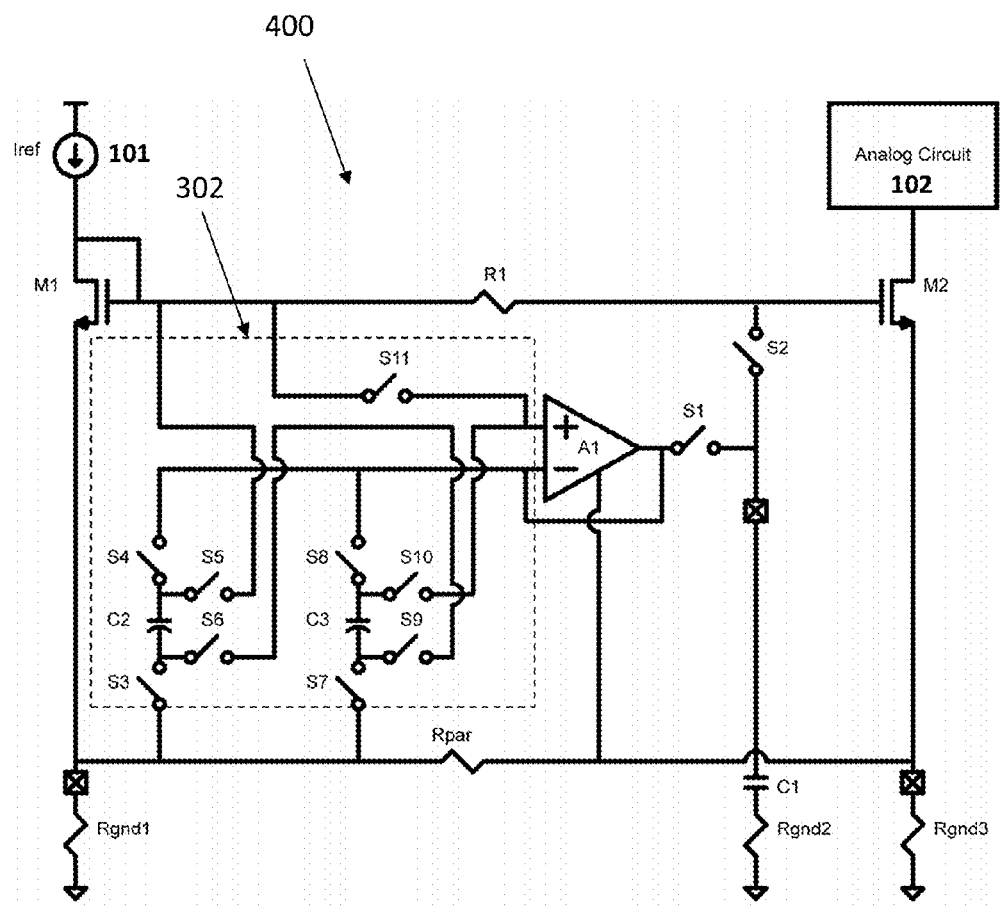
FIG. 4 illustrates a detailed implementation of the circuit of FIG. 3, according to a non-limiting embodiment.

FIG. 4 illustrates a non-limiting detailed implementation of the circuit 300 of FIG. 3, including a non-limiting detailed implementation of the switched capacitor subcircuit 302. As shown, the switched capacitor subcircuit 302 comprises capacitors C2 and C3 (of any suitable values) and switches S3-S11.

Figure 5:
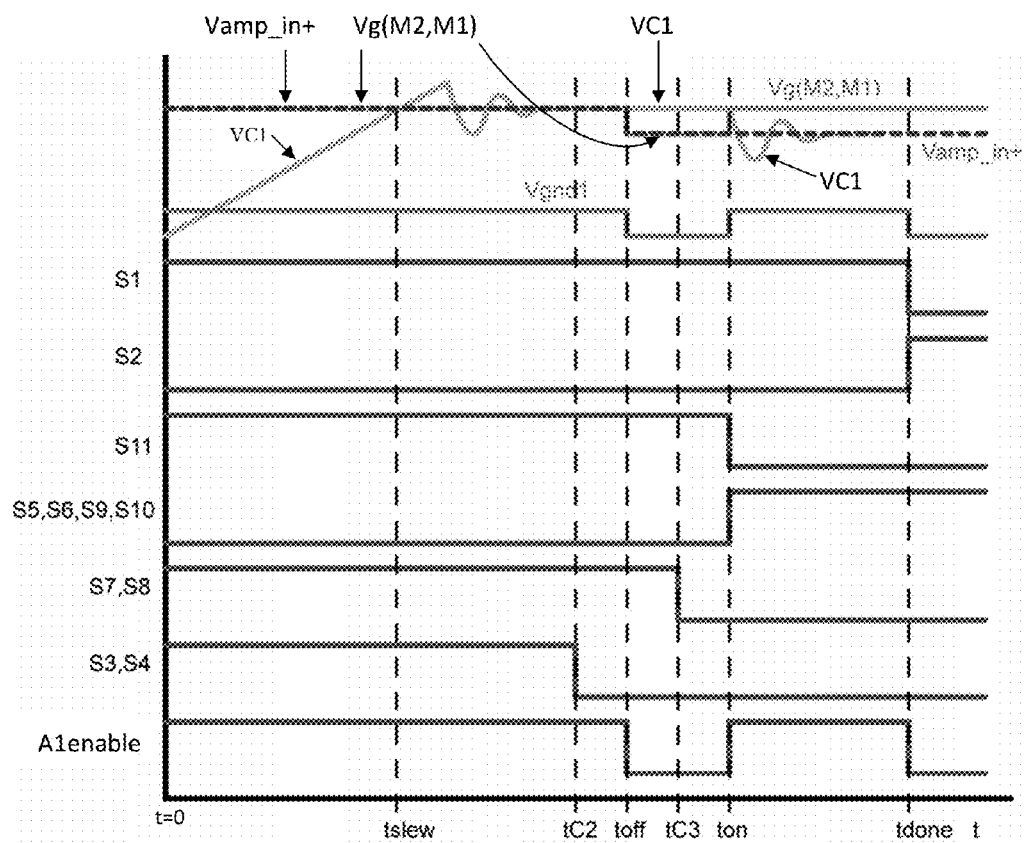
FIG. 5 illustrates a timing diagram corresponding to operation of the circuit of FIG. 4, according to a non-limiting embodiment.

According to a non-limiting embodiment, the circuit of FIG. 4 may operate to sample the voltage difference between Vg(M1) and gnd1 when the current amplifier A1 is off and on. The voltage difference will be different depending on whether the current amplifier A1 is off or on, and thus the described sampling scheme will provide two different voltages. The circuit may then operate to determine a voltage difference between the two voltages (e.g., by subtracting one from the other), and then may apply the determined voltage difference in series with Vg(M1) as the reference voltage for current amplifier A1 during a startup period. FIG. 5 illustrates a timing diagram of such operation.

In FIG. 5, the signals for S1-S11 and the enabling signal A1enable for the current amplifier A1 are digital signals. The high state for such signals indicates a closed switch or enabled circuit, while the low state indicates an open switch or disabled circuit. Other signaling schemes are also possible, as the scheme illustrated is a non-limiting example. The other signals illustrated are analog voltages.

At time t=0, C2 and C3 are connected across VC1 and gnd1 while C1 is connected to the output of A1 and not the gate of M2. The current amplifier A1 is enabled upon start-up (i.e., at t=0) and begins to charge C1 whose voltage is denoted as VC1, and for which the target voltage is the gate voltage of M1. At time tslew the current amplifier A1 completes the voltage slewing phase and begins settling. After some time tC2, VC1 will be within accuracy tolerances (VC1=Vg(M1)) and S3 and S4 are opened, disconnecting C2. The voltage stored on C2 is Vc2=Vgs(M1)=Vg(M1)−(Vgnd1+ΔV), where ΔV is the voltage due to the amplifier current Iamp flowing through Rgnd1 and Vgnd=Is(M1)×Rgnd1.

With this voltage stored on C2, the current amplifier A1 is turned off at toff. Because ΔV becomes zero rapidly (and in some embodiments, immediately), Vgnd1, Vg(M2) and the voltage at the positive input of the current amplifier A1, Vamp_in+, abruptly drop in voltage. Since the current amplifier A1 is disabled it cannot respond to the voltage change at its input. Therefore VC1 remains unchanged.

At tC3, S7 and S8 are opened and the voltage Vc3 across capacitor C3 is given by Vc3=Vgs(M1)=Vg(M1)−Vgnd. The ΔV term is absent since there is no amplifier current to create it.

At t=ton, the current amplifier A1 is again enabled and S5,S6,S9 and S10 are closed while S11 is opened. This connects C1 and C2 in series with the positive input of the current amplifier A1 such that $$\begin{aligned}
\text{Vamp\_in+} &= Vg(M1) + Vc2 - Vc3 = Vg(M1) + Vg(M1) - \\
&\quad (Vgnd1 + \Delta V) - (Vg(M1) - Vgnd) \\
&= Vg(M1) - \Delta V.
\end{aligned}$$
(Equaiton 1)

Substituting $Vg(M1) = Vgs(M1) + Vgnd + \Delta V$ gives:

$$\begin{aligned}
\text{Vamp\_in+} &= Vgs(M1) + Vgnd + \Delta V - \Delta V \\
&= Vgs(M1) + Vgnd
\end{aligned}$$

Note that Equation 1 lacks the error voltage, ΔV, since the amplifier current is absent. Therefore when the current amplifier is again enabled at t=ton, Vg(M1) jumps back up to its previous voltage but the positive amplifier input remains at Vamp_in+=Vgs(M1)+Vgnd. Therefore, the current amplifier A1 charges capacitor C1 to the correct voltage, VC1=Vgs(M1)+Vgnd. Note that between t=0 and t=ton the values of Vamp_in+ and Vg(M2, M1) overlap. After the voltage on capacitor C1 settles, the current amplifier A1 is powered down at tdone. Also at tdone, S1 is opened and S2 is closed, connecting correctly charged capacitor C1 to the gate of M2 and completing the startup. In this manner, the ground offset voltage arising from operation of the current amplifier may be compensated.

The operation of circuits according to aspects of the present application may be rapid, in that the circuits may charge a capacitor to a desired voltage rapidly. For example, the operation illustrated in FIG. 5 may be performed in less than 40 milliseconds, less than 30 milliseconds, less than 20 milliseconds, less than 10 milliseconds, less than 5 milliseconds, less than 3 milliseconds, between 2 and 10 milliseconds, between 2 and 5 milliseconds, between 1 and 5 milliseconds or any other suitable timing. Thus, it should be appreciated that aspects of the present application provide for rapid and accurate charging of capacitors. The operation may be particularly useful in oscillator applications in which it is desired to get a resonator on frequency in a short time (e.g., in less than 10 milliseconds).

The capacitors C2 and C3 in FIG. 4 may have any suitable capacitance values. If the settling time shown in FIG. 5 is longer than desired, then the values of C2 and C3 may be increased. However, it may be desirable for C2 and C3 to not be too large since larger capacitors may consume more chip real estate and because too much current may be required to charge them. Thus, the exact values to select for capacitors C2 and C3 may depend on an intended application of the circuit.

Figure 6:
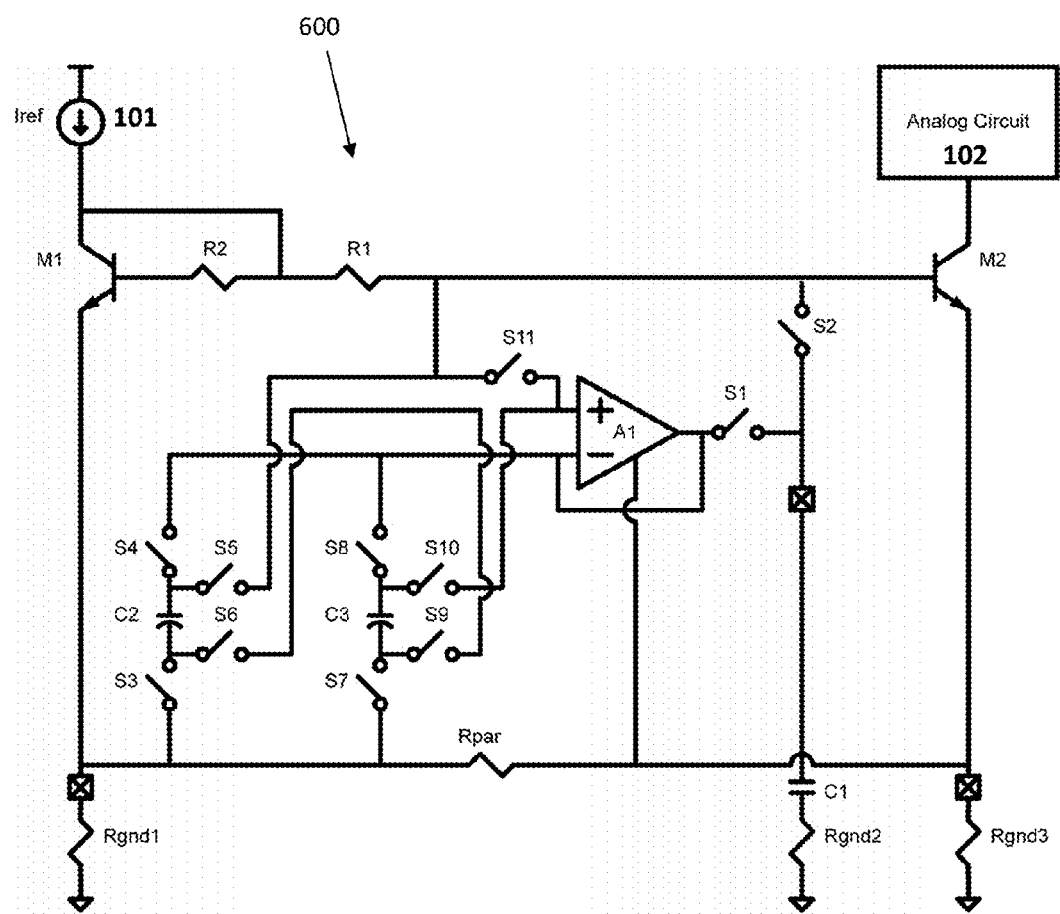
FIG. 6 illustrates an alternative to the circuit of FIG. 4, in which bipolar junction transistor technology is used in a circuit for charging a capacitor, according to a non-limiting embodiment.

FIG. 4 illustrates an example of a circuit implementing MOS technology. However, variations are possible. For example, a circuit utilizing bipolar junction transistor (BJT) technology may alternatively be used. FIG. 6 illustrates a non-limiting example of a circuit 600. The circuit is similar to the circuit of FIG. 4, but the transistors M1 and M2 are BJTs, and an extra resistor R2 is added between the base of transistor M1 and the base of transistor M2. The circuit may operate in substantially the same manner as that previously described in connection with FIG. 5. Other technologies, such as BiCMOS may alternatively be used.

It should be appreciated from the foregoing description that aspects of the present application provide for cancellation of an offset voltage in a charging circuit. Moreover, aspects of the present application provide for cancellation of a ground offset voltage (in addition to any other offset voltage generated by a charging element or other element of the circuit). Conventional circuits did not address the ground offset voltage of a charging circuit arising due to ground impedances. By contrast, aspects of the present application compensate for both: (1) offset voltages (which may be referred to as offset cancellation); and (2) ground offset (which may be referred to as ground cancellation). Thus, rapid and accurate charging of capacitors may be achieved irrespective of ground impedances.

It should also be appreciated that the various aspects described herein are not limited to circuits and methods for charging capacitors in connection with operation of an oscillator. While oscillators represent an example of a circuit for which a capacitor may need to be charged and which may have strict timing tolerances, other types of circuits (e.g., other analog circuits, such as a differential pair) may benefit from one or more aspects of the present application. Non-limiting examples of circuits to which aspects of the present application may apply and be beneficial include filters, sampling networks, and charge pumps. Aspects of the present application are also compatible with amplifier offset and noise cancellation techniques such as auto zeroing.

It should be appreciated from the foregoing that according to an aspect of the present application, an integrated circuit is provided, comprising a charging element configured to couple to a capacitor to provide a charging signal to the capacitor, and means for providing a reference voltage to the charging element, the reference voltage lacking an offset voltage representing a voltage generated by the charging element. The means for providing the reference voltage to the charging element may be configured to sample the offset voltage during two distinct periods. The means for providing the reference voltage may comprise means for combining two separately sampled voltages generated during different states of operation of the charging element. One of the two different states of operation of the charging element may be an ON state, and the other of the two different states of operation of the charging element may be an OFF state.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present application involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Elements other than those specifically identified by the "and/or" clause may optionally be present, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A device, comprising:
an analog circuit; and
a charging circuit coupled to the analog circuit and configured to charge a capacitor coupled to the analog circuit to a target voltage, the charging circuit comprising:
a charging element configured to couple to and charge the capacitor to a target voltage;

a subcircuit coupled to the charging element and configured to detect an offset voltage between the target voltage and an actual voltage to which the capacitor is charged by the charging element when charging is stopped and to provide a compensation signal to the charging element to cause the charging element to adjust the actual voltage to the target voltage based on the offset voltage; and at least one terminal coupling the capacitor to the analog circuit to control, at least in part, operation of the analog circuit with the target voltage.

2. The device of claim 1, wherein the offset voltage depends on a current discharged by the charging element when the charging element is enabled.

3. The device of claim 1, wherein the offset voltage is proportional to a current discharged by the charging element when the charging element is enabled.

4. The device of claim 1, wherein the offset voltage comprises a difference between a first voltage at a ground terminal of the device when the charging element is enabled and a second voltage at the ground terminal of the device when the charging element is disabled.

5. The device of claim 1, wherein the charging element comprises an operational amplifier.

6. The device of claim 1, wherein the subcircuit comprises a switched capacitor circuit.

7. The device of claim 6, wherein the switched capacitor circuit comprises first and second capacitors switchably couplable in parallel between a negative input terminal of the charging element and a reference potential.

8. The device of claim 6, wherein the switched capacitor circuit comprises first and second capacitors switchably couplable in series between a positive input terminal of the charging element and a source.

9. A charging circuit, comprising:
    a charging element configured to couple to and charge a capacitor to a target voltage;
    a subcircuit coupled to the charging element and configured to detect an offset voltage between the target voltage and an actual voltage to which the capacitor is charged by the charging element when charging is stopped and to provide a compensation signal to the charging element to cause the charging element to adjust the actual voltage based on the offset voltage; and
    at least one terminal configured to couple the capacitor to an analog circuit to control, at least in part, operation of the analog circuit with the target voltage.

10. The charging circuit of claim 9, further comprising the capacitor.

11. The charging circuit of claim 9, wherein the charging element is an amplifier.

12. The charging circuit of claim 11, wherein the charging element is an operational amplifier.

13. The charging circuit of claim 11, wherein the capacitor is a first capacitor, and wherein the subcircuit comprises a second capacitor configured to store a first voltage when the charging element is activated and a third capacitor configured to store a second voltage when the charging element is disabled.

14. The charging circuit of claim 9, wherein the subcircuit comprises a switched capacitor circuit.

15. The charging circuit of claim 9, wherein the capacitor is coupled to the analog circuit through a field effect transistor (FET).

16. A method of operating a charging circuit, comprising:
    connecting a first capacitor of a switched capacitor subcircuit during a first switching interval to store a first voltage thereon;
    connecting a second capacitor of the switched capacitor subcircuit during a second switching interval to store a second voltage thereon;
    disabling a charging element during the first switching interval or second switching interval;
    coupling the first and second capacitors during a third switching interval to form a voltage difference between the first and second voltages; and
    applying the voltage difference to an input of the charging element of the charging circuit,
    wherein the voltage difference comprises a voltage offset representing an offset voltage created by the charging element.

17. The method of claim 16, wherein the charging element is a current amplifier, and wherein the voltage difference is applied as a reference voltage to an input of the current amplifier.

18. The method of claim 16, further comprising applying an output from the charging circuit to a biasing circuit for a current mirror.

19. The method of claim 16, wherein coupling the first and second capacitors during the third switching interval comprises configuring the first and second capacitors in series with the input of the charging element.

20. The method of claim 16, wherein the voltage offset is generated by a current of the charging element flowing through a ground impedance.

* * * * *